US007131094B2

(12) United States Patent
Kolk et al.

(10) Patent No.: US 7,131,094 B2
(45) Date of Patent: Oct. 31, 2006

(54) METHOD AND SYSTEM FOR AUTOMATICALLY EXTRACTING DATA FROM A TEXTUAL BUMP MAP

(75) Inventors: Herbert R. Kolk, Southborough, MA (US); Warren R. Anderson, Westborough, MA (US); Christopher L. Houghton, Westborough, MA (US); John A. Kowaleski, Princeton, MA (US)

(73) Assignee: Hewlett-Packard Development Company, LP., Houston, TX (US)

( * ) Notice: Subject to any disclaimer, the term of this patent is extended or adjusted under 35 U.S.C. 154(b) by 209 days.

(21) Appl. No.: 10/735,549

(22) Filed: Dec. 12, 2003

(65) Prior Publication Data

US 2005/0132317 A1 Jun. 16, 2005

(51) Int. Cl.
*G06F 17/50* (2006.01)
(52) U.S. Cl. ............................ 716/12; 716/13; 716/14
(58) Field of Classification Search ............. 716/1–18; 345/426–588; 438/129
See application file for complete search history.

(56) References Cited

U.S. PATENT DOCUMENTS

| 5,949,424 | A  | * | 9/1999  | Cabral et al. ............... 345/426 |
| 6,384,824 | B1 | * | 5/2002  | Morgan et al. ............. 345/426 |
| 6,499,134 | B1 | * | 12/2002 | Buffet et al. ................. 716/12 |
| 6,581,189 | B1 | * | 6/2003  | Tain ............................... 716/3 |
| 6,671,868 | B1 | * | 12/2003 | Lie ............................... 716/16 |
| 6,792,584 | B1 | * | 9/2004  | Eneboe et al. ................ 716/8 |
| 6,823,501 | B1 | * | 11/2004 | Dahl ............................ 716/9 |
| 6,916,995 | B1 | * | 7/2005  | Seaman et al. ............. 174/255 |
| 6,980,211 | B1 | * | 12/2005 | Lin et al. .................... 345/440 |
| 7,065,731 | B1 | * | 6/2006  | Jacques et al. ............... 716/13 |

OTHER PUBLICATIONS

Yang et al., Multi-layer Area Routing Algorithm with Optimized Pin Mapping Strategy, Oct. 2003, IEEE, pp. 229-232.*
Lesley Polka et al., "Package-Level Interconnect Design for Optimum Electrical Performance," Intel Technology Journal Q3, 2000, pp. 1-17.
George A. Riley, "Picking Your Flipchip: A Comparison of Flipchip Methods and Benefit," 6 pp. [online] http://www.flipchips.com/SMErev01.htm. , Third Quarter 2000, printout date Oct. 13, 2003.
"Calculating the Number of Bumps Needed," 15 pp. , printout date Oct. 12, 2003 [online] http://www.artwork.com.
"Die-Bump Designer Suite," CAD Design Software, 4 pp., date unavailable.

* cited by examiner

*Primary Examiner*—A. M. Thompson
*Assistant Examiner*—Nghia M. Doan

(57) ABSTRACT

A system is provided that includes a CPU, a graphical user interface coupled to the CPU, and a memory coupled to the CPU. The memory stores a bump map application and a data extraction application executed by the CPU. The bump map application displays a plurality of editable textual character groups representative of a plurality of bumps. The textual character groups are arranged on the graphical user interface according to a relative coordinate position of the bumps with respect to an origin. The data extraction application automatically extracts data from the bump map application for use by a router application.

22 Claims, 7 Drawing Sheets

FIGURE 2A

|  | 1 | 2 | 3 | 4 | 5 | 6 | 7 | 8 | 9 | 10 | 11 | 12 |
|---|---|---|---|---|---|---|---|---|---|---|---|---|
| 1 | VDD | VSS | VDD | VSS | VDD | VSS | VDD | VSS | VDD | VSS | VDD | VSS |
| 2 | NULL | NULL | NULL | NULL | NULL | NULL | NULL | NULL | NULL | NULL | NULL | NULL |
| 3 | NULL | NULL | NULL | NULL | NULL | NULL | NULL | NULL | NULL | NULL | NULL | NULL |
| 4 | NULL | NULL | NULL | NULL | NULL | NULL | NULL | NULL | NULL | NULL | NULL | NULL |
| 5 | NULL | NULL | NULL | NULL | NULL | NULL | NULL | NULL | NULL | NULL | NULL | NULL |
| 6 | NULL | NULL | NULL | NULL | NULL | NULL | NULL | NULL | NULL | NULL | NULL | NULL |
| 7 | DBGUL<3> | DBGUL<5> | DBGUL<8> | DBGUL<11> | DBGUL<13> | DBGUL<16> | DBGUL<21> | DBGUL<19> | DBGUL<24> | DBGUL<22> | DBGUL<30> | DBGUL<31> |
| 8 | VSS_IO | VSS_IO | VSS_IO | VSS_IO | VSS_IO | VSS_IO | VSS_IO | VSS_IO | VSS_IO | VSS_IO | VSS_IO | VSS_IO |
| 9 | DBGUL<4> | DBGUL<6> | DBGUL<9> | DBGUL<12> | DBGUL<34> | DBGUL<17> | DBGUL<20> | DBGUL<14> | DBGUL<36> | DBGUL<37> | VDD_R | VDD_R |
| 10 | VDD_IO | VDD_IO | VDD_IO | VDD_IO | VDD_IO | VDD_IO | VDD_IO | VDD_IO | VDD_IO | VDD_IO | VDD_IO | VDD_R |
| 11 | DBGUL<7> | DBGUL<10> | DBGUL<15> | DBGUL<18> | DBGUL<23> | DBGUL<26> | DBGUL<25> | DBGUL<28> | VSS_R | VSS_R | VSS_R | VSS_R |
| 12 | VSS_IO | VSS_IO | VSS_IO | VSS_IO | VSS_IO | VSS_IO | VSS_IO | VSS_IO | VSS_IO | VSS_IO | VSS_IO | VSS_IO |
| 13 | VDD_R | VDD_R | VDD_R | VDD_R | VDD_R | VDD_R | VDD_R | VDD_R | VDD_R | VDD_R | VDD_R | VDD_R |
| 14 | VSS_R | VSS_R | VSS_R | VSS_R | VSS_R | VSS_R | VSS_R | VSS_R | VSS_R | VSS_R | VSS_R | VSS_R |
| 15 | VDD_R | VDD_R | VDD_R | VDD_R | VDD_R | VDD_R | VDD_R | VDD_R | VDD_R | VDD_R | VDD_R | VDD_R |
| 16 | VSS_R | VSS_R | VSS_R | VSS_R | VSS_R | VSS_R | VSS_R | VSS_R | VSS_R | VSS_R | VSS_R | VSS_R |
| 17 | VDD_R | VDD_R | VDD_R | VDD_R | VDD_R | VDD_R | VDD_R | VDD_R | VDD_R | VDD_R | VDD_R | VDD_R |

| | 1 | 2 | 3 | 4 | 5 | 6 | 7 | 8 | 9 | 10 | 11 | 12 |
|---|---|---|---|---|---|---|---|---|---|---|---|---|
| | ...CONTINUED FROM FIGURE 2A | | | | | | | | | | | |
| 18 | VSS_R | VSS_R | VSS_R | VSS_R | VSS_R | VSS_R | VSS_R | VSS_R | VSS_R | VSS_R | VSS_R | VSS_R |
| 19 | VDD_R | VDD_R | VDD_R | VDD_R | VDD_R | VDD_R | VDD_R | VDD_R | VDD_R | VDD_R | VDD_R | VDD_R |
| 20 | VSS_R | VSS_R | VSS_R | VSS_R | VSS_R | VSS_R | VSS_R | VSS_R | VSS_R | VSS_R | VSS_R | VSS_R |
| 21 | VDD_R | VDD_R | VDD_R | VDD_R | VDD_R | VDD_R | VDD_R | VDD_R | VDD_R | VDD_R | VDD_R | VDD_R |
| 22 | VSS_R | VSS_R | VSS_R | VSS_R | VSS_R | VSS_R | N_DATA_OUT_H<8> | N_DATA_OUT_H<9> | VDDX1 | N_DATA_OUT_ECC_H<1> | N_DATA_OUT_H<23> | N_DATA_OUT_H<22> |
| 23 | | VDD_R | VDD_R | VDD_R | VDD_R | VSS_R | VSS_IO | VSS_IO | VSS_IO | VSS_IO | VSS_IO | VSS_IO |
| 24 | VDD_R | VSS_R | VSS_R | VSS_R | VSS_R | VSS_R | N_DATA_OUT_H<15> | VDDX1 | N_DATA_OUT_ECC_H<6> | N_DATA_OUT_ECC_H<4> | N_DATA_OUT_H<14> | VDDX1 |

| TBL_M8GRID GRID NAME USED TO REFERENCE THIS TABLE | 2 WIDTH (ADU) | 3 SPACE TO LEFT (ADU) | 4 SPACE TO RIGHT (ADU) | 5 M8 GRID EDGE OFFSET (ADU) | 6 COMMENTS |
|---|---|---|---|---|---|
| IO_3 | 100 | 0 | 50 | 1234 | LEFT EDGE OF THIS TRACK RELATIVE TO 0,0 OF CHIP |
| VSS_1 | 100 | 50 | 50 | 1384 | |
| LCLK_1 | 50 | 50 | 50 | 1534 | |
| VDD_1 | 100 | 50 | 100 | 1634 | |
| VSS_2 | 100 | 100 | 100 | 1834 | |
| CLOCK | 150 | 100 | 50 | 2034 | |
| VDD_2 | 100 | 50 | 50 | 2234 | |
| VSS_3 | 100 | 50 | 50 | 2384 | |
| LCLK_2 | 50 | 50 | 50 | 2534 | |
| VDD_3 | 100 | 50 | 50 | 2634 | |
| SPECIAL | 100 | 50 | 50 | 2784 | |
| IO_1 | 100 | 50 | 50 | 2934 | |
| IO_2 | 100 | 50 | 50 | 3084 | 3134 THIS IS USED IN THE DRIVER_SHIFT SPREAD SHEET |
| IO | 450 | 50 | 50 | 2934 | SPECIAL CENTER FOR WIDE IO |

{302}

| BUMP_OFFSET(ADU) | 1234 |
|---|---|
| M8GRID_PITCH(ADU) | 2000 |
| M8GRID_LAYER | 8 |

FIGURE 4

| !(DEFINITION CONTINUES UNTIL END STATEMENT, REGION COORDINATES ARE IGNORED) | | | | | | | | | |
|---|---|---|---|---|---|---|---|---|---|
| MACRO 402 | VSS_VDD_M8 404 | | | | | | | | |
| !COMMENT | | | | | | | | | |
| | LOWER X | LOWER Y | UPPER X | UPPER Y | LAYER | OFFSET | PITCH | WIDTH | SIG | DATA TYPE | GRID PTR |
| | 0 | 0 | 0 | 0 | 8 | 1384 | 2000 | 100 | VSS | 20 | VSS_1 |
| | 0 | 0 | 0 | 0 | 8 | 1634 | 2000 | 100 | VDD | 21 | VDD_1 |
| | 0 | 0 | 0 | 0 | 8 | 1834 | 2000 | 100 | VSS | 20 | VSS_2 |
| | 0 | 0 | 0 | 0 | 8 | 2234 | 2000 | 100 | VDD | 21 | VDD_2 |
| | 0 | 0 | 0 | 0 | 8 | 2384 | 2000 | 100 | VSS | 20 | VSS_3 |
| | 0 | 0 | 0 | 0 | 8 | 2634 | 2000 | 100 | VDD | 21 | VDD_3 |
| END | !VSS_VDD_M8 | | | | | | | | |

400 — 406 (GRID PTR column group) — 410 — 408

FIGURE 5

| LOWER X | LOWER Y | UPPER X | UPPER Y | | | | | | | MACRO NAME |
|---|---|---|---|---|---|---|---|---|---|---|
| 4326 | 5987 | 268765 | 32451 | 0 | 0 | 0 | 0 | 0 | 0 | VSS_VDD_M8 |

500

METHOD AND SYSTEM FOR AUTOMATICALLY EXTRACTING DATA FROM A TEXTUAL BUMP MAP

BACKGROUND

Integrated circuits (ICs) are continually increasing in complexity. When designing an integrated circuit, computer aided design (CAD) programs may be used to layout electronic components (e.g., transistors, capacitors, resistors, inductors), contacts for the components, interconnects between components, and bumps that are used to connect a semiconductor die to a package. Unfortunately, the process of integrated circuit layout may require a significant amount of time and is prone to human error. Therefore, methods and systems that may reduce human error and/or expedite the amount of time required for circuit layout design and maintenance are desirable.

SUMMARY

The problems noted above are solved in large part by a method and system for automatically extracting data from a bump map. One exemplary embodiment may be a system comprising a CPU, a graphical user interface coupled to the CPU, and a memory coupled to the CPU. The memory stores a bump map application and a data extraction application executed by the CPU, wherein the bump map application displays a plurality of editable textual character groups representative of a plurality of bumps that are arranged on the graphical user interface according to a relative coordinate position of the bumps with respect to an origin. In some embodiments, the data extraction application automatically extracts data from the bump map application for use by a router application.

BRIEF DESCRIPTION OF THE DRAWINGS

For a detailed description of exemplary embodiments of the invention, reference will now be made to the accompanying drawings in which:

FIGS. 2A–2B illustrate an exemplary bump map in accordance with embodiments of the invention;

FIG. 3 illustrates exemplary track definition tables in accordance with embodiments of the invention;

FIG. 4 illustrates a macro for defining track parameters in accordance with embodiments of the invention;

FIG. 5 illustrates a table for defining a two dimensional space associated with the macro of FIG. 4 in accordance with embodiments of the invention;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection, or through an indirect electrical connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure. In addition, one skilled in the art will understand that the following description has broad application, and the discussion of any embodiment is meant only to be exemplary of that embodiment, and not intended to intimate that the scope of the disclosure is limited to that embodiment.

Factors that may influence the complexity of an IC comprise: the number of components on the IC, the function of the IC, and/or performance considerations (e.g., speed, power consumption, and resistance to electrical noise). For example, when the number of power connections and signal connections increase, the complexity of managing the chip to package connections, the package to printed circuited (PC) board connections, and the signal integrity in affected domains (i.e., regions) of the IC increases.

Design factors such as those described above may be virtually implemented and edited during design of an IC using computer aided design (CAD) programs capable of laying out the electrical components, connecting the components, testing connections, and approximating operation of the circuitry. Additionally, a router program may be used to display features such as the physical size, and the coordinates of tracks (i.e., metal connections) used for each layer of the IC. Embodiments of the invention are intended to automate and/or significantly facilitate laying out metal layers (including bumps) of an IC. In particular, methods and systems for managing, editing, and using data related to metal tracks and/or bumps of an IC are presented herein.

Figure 1:
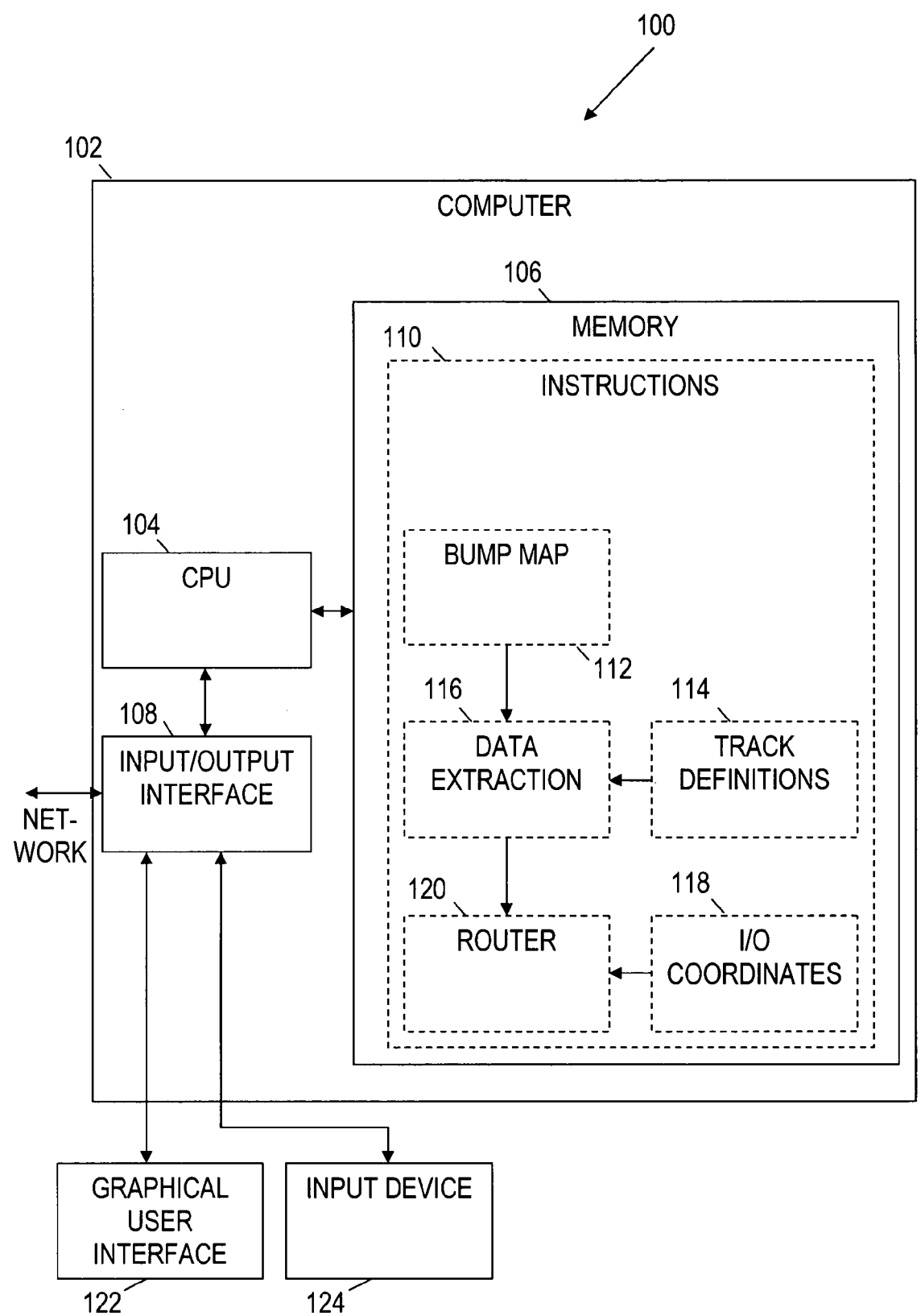
FIG. 1 illustrates a block diagram of a system in accordance with embodiments of the invention.

FIG. 1 illustrates a block diagram of a system 100 in accordance with embodiments of the invention. As illustrated in FIG. 1, the system 100 may comprise a computer 102 having a CPU 104 that couples to a memory 106 and an input/output interface 108. The input/output interface 108 may couple to a graphical user interface (GUI) 122 and an input device 124. The memory 106 may comprise computer readable instructions 110 including a bump map application 112, a track definition application 114, a data extraction application 116, an input/output (I/O) coordinates application 118, and router program application 120.

The input device 124 may comprise devices such as a keyboard and/or a mouse. In accordance with a least some embodiments, the bump map application 112, when executed by the CPU 104, may display an application window on the GUI 122. For example, in some embodiments, the bump map application 112 may be presented is a spreadsheet format, such as a spreadsheet application. The bump map provided by the bump map application 112 may comprise a plurality of editable alphanumeric characters (textual bump labels) that represent a plurality of bumps. The position of the text in the application window also may be editable and may represent relative bump coordinates. For example, bump labels in the upper left, upper right, lower left, and lower right corners of the application window may be representative of bumps located in the upper left, upper right, lower left, and lower right corners of a coordinate grid associated with an IC. In some embodiments, individual cells of a spreadsheet having rows and columns may be used to display the bump labels.

FIGS. 2A–2B illustrate a bump map 200 in accordance with embodiments of the invention. As shown in FIGS. 2A–2B, the bump map 200 may comprise a plurality of rows 202 and columns 204, wherein each cell 205 of the bump map 200 may include a bump label 206, a null designation 208, and/or a color (not shown) associated with a bump label 206 (e.g., red shaded cells may be associated with all "VSS" bump labels). The bump map 200 also may comprise additional information (i.e., parameters) associated with each bump such as the size of the bump, the material from which the bump is made, and/or the pitch (i.e., spacing) between adjacent bumps. These parameters may be included for each cell 205, each bump label 206, and/or the entire bump map 200. For example, in some embodiments, each bump label 206 and/or cell 205 may automatically include data such as the parameters described above.

Returning to FIG. 1, the track definitions application 114, when executed by the CPU 104, may display an application window on the GUI 122. The application window related to the track definitions application 114, may comprise one or more tables, templates, and/or macros that define tracks (i.e., connections) used for one or more metal layers of an IC. The track definitions may comprise track-related information such as an IC layer of a track, a name associated with a track, a spacing between tracks, a track width, a track material, and track priority levels.

The data extraction application 116 may comprise instructions written in a programming language (e.g., C, C++, Java, or other known or later developed programming languages). When executed by the CPU 104, the data extraction application 116 may extract data stored according to the bump map application 112 and track definitions application 114 and provide the data to the router application 120. In some embodiments, the data extraction application 116 also may extract data from the I/O coordinates application 118 and provide the data to the router application 120.

The I/O coordinates application 118, when executed by the CPU 104, may extract coordinate positions of IC receivers (i.e., transistors that receive signals from off an IC) and drivers (i.e., transistors that send signals off an IC) from a CAD circuit design program. These I/O coordinates may be stored in a data file and provided to the router application 120 when needed. As previously mentioned, the I/O coordinates may be extracted from a data file by the data extraction application 116, whereby the router may receive and interpret the I/O coordinates.

The router application 120, when executed by the CPU 104, may create and display routing connections (e.g., between bumps and/or I/O circuitry) for various layers of an IC. In some embodiments, the router application 120 may provide a gridless programmable line probe router. This type of router application may use objects such as obstructions, holes (i.e., metal representation of endpoints of connections), vias (i.e., metal contacts between metal layers), via and route restrictions, and connections to display routes to a user by way of GUI 122. In particular, data extracted from the bump map application 112, the track definitions application 114, and/or the I/O coordinates application 118 may be interpreted by the router application 120 to display tracks on the GUI 122 corresponding to one or more layers of an IC.

In at least some embodiments, the router application 120 may associate bumps with I/O circuitry according to signal names (e.g., VSS_R, VDD). The router application 120 also may cause the GUI 122 to display straight line ("flyline") connections between bumps and the I/O circuitry. By displaying the flyline connections, a user may inspect the length of connections between bumps and associated I/Os and/or whether connections between bumps and I/Os cross each other. In many applications, it may be desirable for connections between I/Os and bumps to be shorter rather than longer. A shorter connection between a bump and an I/O may provide benefits such as improved speed and/or less signal distortion by reducing resistance and capacitance caused by the connection. Likewise, avoiding crossed signals is desirable. Specifically, crossing signal tracks (i.e., conductive traces) at the same IC layer may cause a short circuit, while crossing signal tracks on separate IC layers may cause undesirable effects such as cross talk (i.e., signals interfering with each other). If a user desired to change a position and/or parameters of one or more bumps, that user may access and edit the bump map associated with the bump map application 112. As previously explained, using a spreadsheet for the bump map may permit a user to easily edit bump locations and other parameters associated with each bump or the entire bump map.

Additionally or alternatively to displaying the flyline connections described above, the router application 120 may cause the GUI 122 to display one or more layers of vertical and horizontal "tracks" that connect each bump to an associated I/O location. As will later be described, the router application 120 may position these tracks according to a predetermined order of priority and according to the data provided by the track definitions application 114. In some embodiments, the track definitions application 114 may comprise data describing an area and pattern of the tracks, the width of each track, a layer associated with a track, a material used for the track, and/or the spacing between tracks. In some embodiments, the data in the track definitions application 114 may be stored and presented to the user in the format of a spreadsheet.

Although FIG. 1 illustrates that the bump map application 112, the track definitions application 114, the data extraction application 116, the I/O coordinates application 118, and the router application 120 may be stored using the memory 110 and executed using the CPU 104, other embodiments of the invention may use other configurations. For example, some embodiments may comprise a plurality of computers coupled to each other via a network. In such embodiments, a single computer may store and execute the applications as described above, while other computers may access the applications for editing and/or viewing. Alternatively, the applications described above may be stored and executed on separate computers coupled to each other via a network. Therefore, the bump map application 112, the track definitions application 114, the data extraction application 116, the I/O coordinates application 118, and the router application 120 may be stored and executed using any number of suitable computer readable mediums and computers that permit these applications to function as described herein.

FIG. 3 illustrates an embodiment of a table 300 provided by the track definitions application 114 described in FIG. 1. Specifically, the table 300 may provide definitions related to a metal layer (e.g., metal layer #8) of an IC. As shown in FIG. 3, the table 300 may comprise the column headers "GRID NAME USED TO REFERENCE THIS TABLE," "WIDTH (ADU)," "SPACE TO LEFT (ADU)," "SPACE TO RIGHT (ADU)," "M8 GRID EDGE OFFSET (ADU)," and "COMMENTS." In some embodiments, an ADU (Alpha Design Unit) may comprise an adjustable linear measurement unit (e.g., 0.50 microns) associated with an IC. FIG. 3 also illustrates a table 302 that may provide global definitions related to the table 300. Specifically, the table 302 may provide definitions for an offset of a first bump from a predetermined origin ("BUMP_OFFSET (ADU)"), a grid pitch ("M8GRID_PITCH (ADU)"), and a metal layer ("M8GRID_LAYER"). As shown, by way of example only, these definitions may be 1234, 2000, and 8, respectively.

In the cells below the "GRID NAME USED TO REFERENCE THIS TABLE" column header, a user may inspect and/or edit the names (i.e., labels) of tracks. For example, these track labels may correspond to signal names of an IC. In the cells below the "WIDTH (ADU)" column header, a user may inspect and/or edit a width of each track. In the cells below the "SPACE TO LEFT (ADU)" column header, a user may inspect and/or edit an empty space requirement to the left of a track. In the cells below the "SPACE TO RIGHT (ADU)" column header, a user may inspect and/or edit an empty space requirement to the right of a track. In the cells below the "M8 GRID EDGE OFFSET (ADU)" column header, a user may inspect the distance between the left edge of a track relative to a predetermined (0, 0) position (i.e., origin) of an IC chip. In some embodiments, bold numbering may be used to signify that a value should not be edited (e.g., the value is derived).

FIG. 4 illustrates a macro 400 associated with the tables 300 and 302 shown in FIG. 3. A macro 400 may be a stored sequence of commands or keyboard strokes that is recalled using a single command or keyboard stroke. As shown in FIG. 4, the macro 400 may comprise a predetermined start command 402 (e.g., "macro") that designates the beginning of a macro definition. The macro 400 also may comprise a label or name 404 (e.g., VSS_VDD_M8). The data 406 provided after the start command 402 and the name 404 may be recalled as will be explained below. The macro 400 may comprise an end command 408 that designates the end of the macro definition.

In at least some embodiments, data associated with grid pointers 410 (i.e., labels corresponding to the grid names used in table 300) may be included in cells organized according to the column headers "!COMMENT," "LOWER X," "LOWER Y," "UPPER X," "UPPER Y," "OFFSET," "PITCH," "WIDTH," "SIG," "DATA TYPE," and "GRID PTR." In the macro 400, text that begins with an exclamation point may be entered and edited without affecting the macro 400. For example, a user may enter textual comments (e.g., !need to change width) in the any of the cells below the "!COMMENT" column header without affecting the macro 400. Also, comments may be added to other cells that are not below the "!COMMENT" column header. In the cells under "LOWER X," "LOWER Y," "UPPER X," and "UPPER Y" column headers, data that defines a two-dimensional region may be entered. As shown in FIG. 4, these columns may be filled in with zeros ("0s") signifying that the regions are not defined by the macro 400. In the cells under the "LAYER" column header, a value of 8 may be inserted signifying that the grid pointers 410 of the macro 400 are associated with a metal layer 8. In the cells under the "OFFSET" column layer, values associated with the "M8 GRID EDGE OFFSET" column values shown in FIG. 3 may be inserted. In the cells under the "PITCH" column header, the value associated with the "M8GRID_PITCH" cell shown in table 302 of FIG. 3 may be inserted. In the cells under the "WIDTH" column header, the values associated with the "WIDTH (ADU)" column shown in table 300 of FIG. 3 may be inserted. In the cells under the "SIG" column header, labels used to describe a signal type (e.g., VSS, VDD) may be inserted. In the cells under the "DATA TYPE" column header, values that correspond to track options (e.g., color, dashed lines) provided by the router application 114 may be inserted. In the cells under the "GRID PTR" column header, labels that correspond to one or more grid names used in table 300 may be inserted.

In at least some embodiments, some or all of the data associated with a grid pointer 410 may be entered automatically into the macro 400 upon entering (e.g., typing) the grid pointer 410 label into the macro 400. For example, in some embodiments, the cells under the "LAYER," "OFFSET," "PITCH," and "WIDTH" column headers shown in FIG. 4 that are associated with a grid pointer 410 may be filled in automatically upon entering each grid pointer 410. As previously explained, the data from the tables 300 and 302 may be used to fill in some or all cells of the macro 400. Specifically, if a user types in the label "VSS_1" as a grid pointer 410, the values from tables 300 and 302 that are associated with the VSS_1 label may be filled in automatically. As shown in FIG. 4, the "VSS_1" label may be associated with a metal layer ("LAYER") value of 8, an offset from a (0, 0) position of an IC ("OFFSET") value of 1384, a pitch between bumps ("PITCH") value of 2000, and a width of a track ("WIDTH") value of 100.

FIG. 5 illustrates a definition table 500 that uses the macro 400 shown in FIG. 4. As shown in FIG. 5, a macro name and a region defined by a "LOWER X" coordinate, a "LOWER Y" coordinate, an "UPPER X" coordinate, and an "UPPER Y" coordinate may be entered in the table 500. In the exemplary embodiment of FIG. 5, the six tracks "VSS_1," "VDD_1," "VSS_2," "VDD_2," "VSS_3," and "VDD_3" associated with the macro named "VSS_VDD_M8" shown in FIG. 4 may be repeated in the region described by the "LOWER X" value of 4326, the "LOWER Y" value of 5987, the "UPPER X" value of 268765, and the "UPPER Y" value of 32451.

In at least some embodiments of the invention, tables similar to those illustrated in FIGS. 3, 4, and 5 may be used to define various metal layers of an IC such that a user may inspect and edit parameters stored in the tables. For example, metal layers of an IC may include bumps, bump routes, power supplies, signals, clocks, and special voltage regions. If a user desires to change the location of bumps, the size of the bumps, the material of the bumps, the spacing (i.e., pitch) between bumps, the location of tracks, the spacing of tracks, the width of tracks, the pattern of tracks, and/or the material of the tracks, the information may be accessed and edited in the tables such as those previously described.

While tables and/or spreadsheets comprising cells, columns, rows, and headers have been used to describe embodiments of the invention, the invention is not limited to the use of these tables and/or spreadsheets. Other embodiments of the invention may implement table sizes, parameters, and/or format that vary from the Tables 3–5 described above. Additionally, embodiments of the invention may store and/or present data related to metal layers of an IC using any user-readable format (e.g., text application) that permits editing by a user, and automated extraction of data by a computer program (e.g., the data extraction application 116) for use with IC design programs such as router applications.

In accordance with at least some embodiments of the invention, the router application 120 may lay out the various metal layers according to a predetermined priority. For example, in some embodiments, the router application 120 may lay out metal according to the following order: (1) bumps; (2) power, ground, and clock; (3) input/output signals; and (4) special voltage areas. In some embodiments, the special voltage areas may comprise low noise tracks, certain power tracks, and analog tracks. If a particular lower priority track is to be placed where a higher priority track exists, the router application 120 may "jump over" the space allocated to the higher priority track, then continue placing a pattern of lower priority tracks. This function may be referred to as a "backfill" function of the router application 120. In accordance with at least some embodiments of the invention, the metals of groups (1), (2), (3), and (4) described above may be generated automatically by the router application 120 according to computer readable instructions (e.g., the data extraction application 116) that extract the data from the tables and provide the data to the router application 120.

As previously explained, the router application 120 may cause the GUI 122 to display the metal tracks so that a user may visualize the tracks. If a user desires to edit the parameters of the tracks, then the tables containing information regarding bumps, individual tracks, groups of tracks, regions of tracks, metal layers, and/or all tracks may be accessed and edited accordingly. In at least some embodiments, these tables may be contained in the same source document. For example, tables that describe a bump map (e.g., bump map 200), region definitions of a metal layer (e.g., tables 300 and 302), macros (e.g., table 400) that use the region definitions, and tables that use the macros (e.g., table 500) may be contained in the same source document, thus allowing a user to easily access, visualize, and edit all the information that defines metal layers of an IC. In some embodiments, the upper metal layers (e.g., metal layers 7, 8, and 9) may be defined by the tables described above.

The benefits of managing bump and metal layer information using tables (or any editable application), macros, and data extraction instructions such as those previously described may comprise allowing a user-friendly graphical representation and manipulation of a bump footprint (map), generating bumps automatically from the bump footprint, generating bump routes (tracks) automatically according to some manual set-up work, using a single configuration file for all source data of the bumps and routes, generating power supplies in metal layers automatically, generating signals and clocks automatically, providing an auto-generated template for package layout, and providing one source document for all chip and package metal layers.

Using the above-described tables to define information regarding metal layers of an IC is intended to facilitate the maintenance of the large amount of data that defines an IC. More specifically, the tables and macros described above may permit a user to edit, condense, and expand the amount of data that describes the metal layers of an IC. Using the tables and macros described above also allows users to quickly navigate the large amount of information that defines bumps and metal layers. For example, if a user wants to edit track definitions for special voltages of metal layer 7, the user may access the one source file that contains all of the data defining metal layers and bumps for the IC. The user then may locate the data templates, tables, and/or macros that define the tracks and patterns for special voltages of metal layer 7 and edit these templates, tables, and/or macros accordingly. When the data is needed by a router application 120, computer readable instructions may be used to "flatten" the data (i.e., the condensed data from the tables and/or macros is extracted so that the router may interpret the data correctly).

Figure 6:
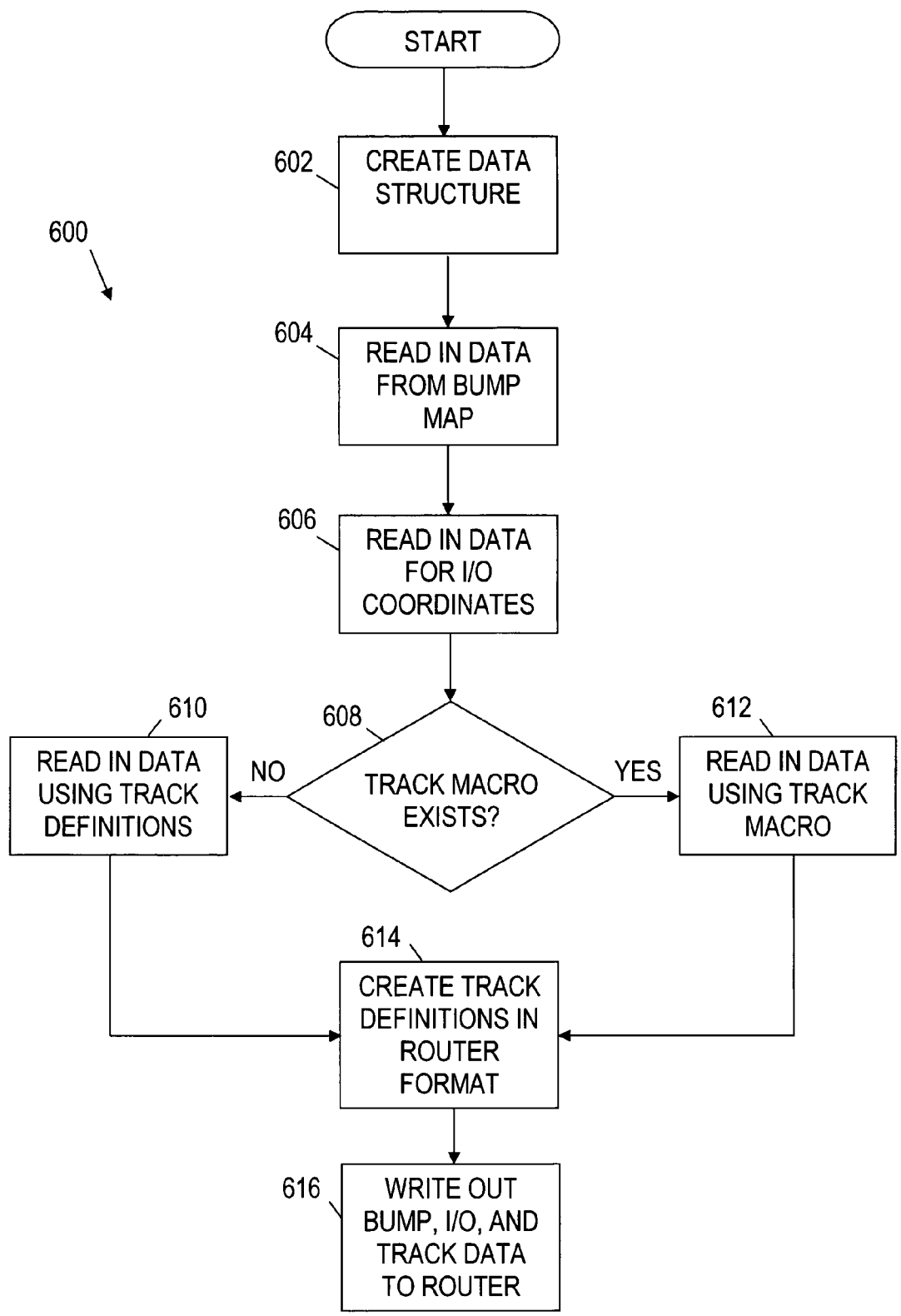
FIG. 6 illustrates a method for providing data to a router in accordance with embodiments of the invention.

FIG. 6 illustrates a method 600 for providing data to a router program in accordance with embodiments of the invention. For example, the method 600 illustrated in FIG. 6 may be performed by the data extraction application 116 described previously for FIG. 1. The method 600 may comprise creating a data structure at block 602 that stores data such that a router may interpret and use the data. The method 600 may further comprise "reading in" (i.e., extracting) data from a bump map (e.g., bump map 200 of FIG. 2) at block 604. At block 606, data from an I/O coordinates data file may be read into the data structure. If a track definition macro exists (e.g., macro 400 of FIG. 4) as determined at block 608, data may be read into the data structure using the track definition macros (block 612). Otherwise, if a track definition macro does not exist (determination block 608), data may be read into the data structure from the track definitions tables (e.g., table 300 and 302 shown in FIG. 3) at block 610. The track definition data may be formatted for a router at block 614. At block 616, data (e.g., bump data, I/O coordinate data, and track data) stored in the data structure may be written out to a router.

In some embodiments, computer readable instructions (e.g., a "C" language program) may be used to create a data structure, read in data from a bump map, I/O coordinate data file, and track definitions, and write out the data to a router application and/or a layout editor as needed. Specifically, the data structure may comprise a layout data file such as a GDS2 format file and/or other data files.

Figure 7:
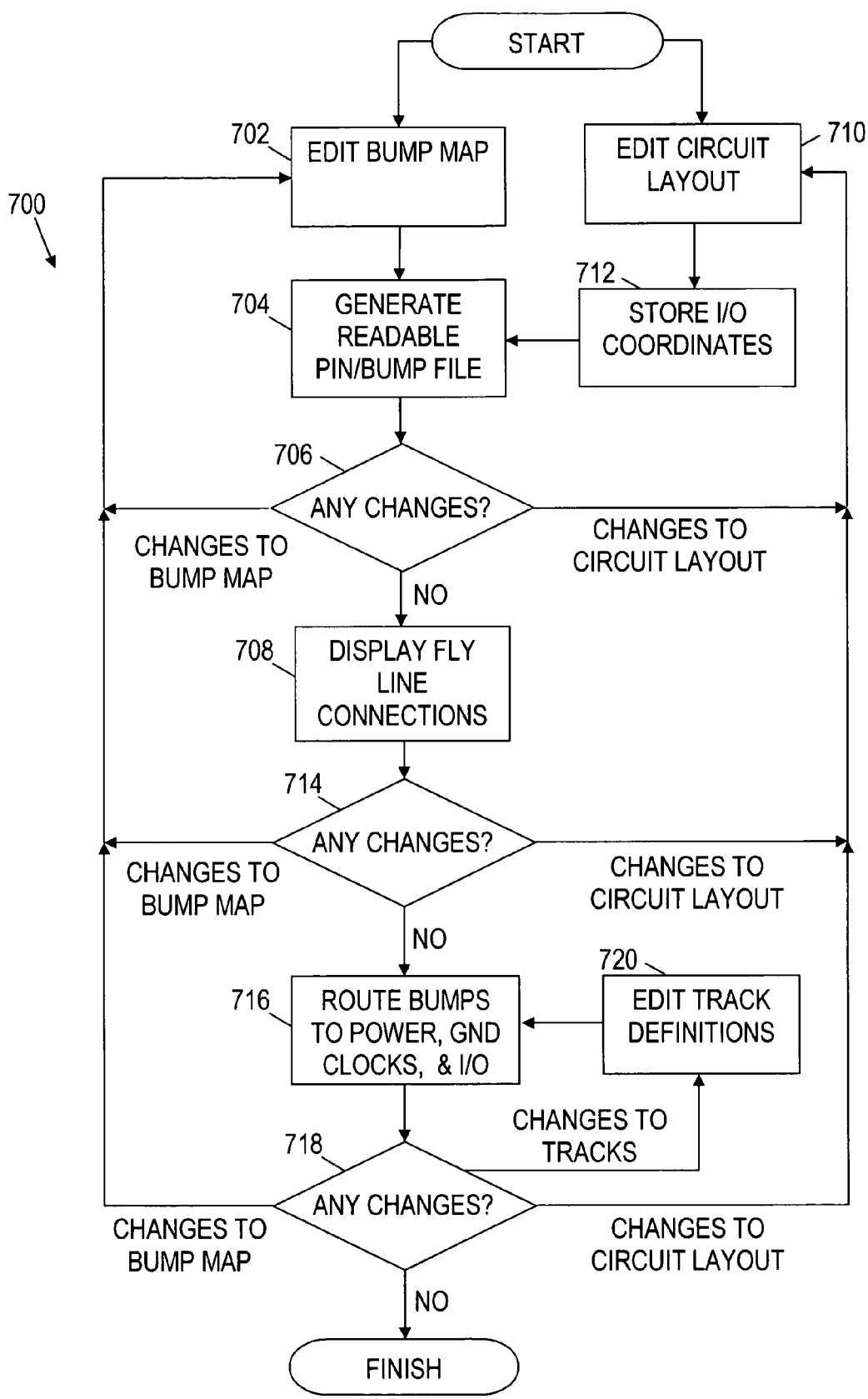
FIG. 7 illustrates a method of how the system illustrated in FIG. 1 may be used.

FIG. 7 illustrates an exemplary method 700 of how the system illustrated in FIG. 1 may be used. As shown in FIG. 7, the method 700 may comprise editing a bump map at block 702. Additionally, a circuit layout may be edited at block 710, wherefrom I/O coordinates may be stored at block 712. At block 704, a readable pin/bump file may be generated from the stored bump map data and I/O coordinate data. At block 706, a determination may be made as to whether the bump map or the circuit layout should be edited. If changes to the bump map are desired (determination block 706), the method 700 returns to block 702, where editing the bump map may occur. If changes to the circuit layout are desired (determination block 706), the method 700 returns to block 710, where editing the circuit layout may occur.

If no changes are desired (determination block 706), flyline (i.e., straight line) connections between bumps and I/Os may be displayed at block 708. As previously explained, flyline connections may provide information regarding the length of the tracks that will connect bumps to I/Os (e.g., receivers or drivers) and/or whether tracks will cross each other. If changes to the bump map are desired (determination block 714), the method 700 may return to block 702, where editing the bump map may occur. If changes to the circuit layout are desired (determination block 714), the method 700 may return to block 710, where editing the circuit layout may occur. If no changes are desired (determination block 714), the bumps may be routed to power, ground ("GND"), clocks, and I/O coordinates at block 716.

If changes to the bump map are desired (determination block 718), the method 700 may return to block 702, where editing the bump map may occur. If changes to the circuit layout are desired (determination block 718), the method 700 may return to block 710, where editing the circuit layout may occur. If changes to tracks are desired (determination block 718), the method 700 may return to block 720, where editing track definitions may occur. These track definitions may comprise tables (or other editable applications) and macros such as those described above in FIGS. 3, 4, and 5. As previously explained, a router application 120 may use bump map data, I/O coordinate data, and track definition data to route the bumps to power, ground, clocks, and I/O circuitry. If at block 718 it is determined that no changes are desired the method 700 may be finished.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
a central processing unit (CPU);
a graphical user interface (GUI) coupled to the CPU;
a memory coupled to the CPU, wherein the memory stores a bump map application and a data extraction application executed by the CPU, wherein the bump map application displays a plurality of editable textual character groups representative of a plurality of bumps, the textual character groups are arranged on the GUI according to a relative coordinate position of the bumps with respect to an origin;
wherein the memory also stores a track definition application executed by the CPU, the track definition application displaying track parameters on the GUI;
wherein the data extraction application automatically extracts bump data from the bump map application;
wherein the data extraction application determines if the track definition application provides a macro defining a plurality of tracks;
wherein, if the track definition application provides the macro, the data extraction application extracts track parameters based on the macro;
wherein, if the track definition application does not provide the macro, the data extraction application extracts track parameters based on individual track definitions; and
wherein a router application uses the extracted bump data and extracted track parameters to create integrated circuit routing connections.

2. The system of claim 1 further comprising an input device coupled to the CPU, wherein the input device is used with the bump map application such that a user is able to change a position of each textual character group displayed on the graphical user interface.

3. The system of claim 2 wherein the input device permits the user to edit textual characters of the textual character groups.

4. The system of claim 1 wherein the bump map application further displays a plurality of cells, wherein each cell is adapted to contain a textual character group.

5. The system of claim 4 wherein each cell comprises information regarding a two-dimensional space.

6. The system of claim 4 wherein each cell is shaded in one of a plurality of colors, wherein each color signifies information to a user.

7. The system of claim 1 wherein the track definition application displays on the GUI one or more sets of intersecting columns and rows containing editable information that describes tracks of an integrated circuit.

8. The system of claim 7 wherein the bump map application and the track definition application are a single application that uses a single source file.

9. The system of claim 7 wherein the data extraction application extracts track-related data from the track definition application and organizes the track-related data for use by the router application.

10. The system of claim 7 wherein at least one of the sets of intersecting columns and rows displays information selected from the group consisting of:
a name associated with a set of intersecting rows and columns;
a metal layer associated with a set;
a label associated with a track;
a width of the track;
a space requirement on a left side of the track;
a space requirement on a right side of the track;
an offset of the track from a predetermined origin;
a pitch between tracks; and
comments related to the track.

11. The system of claim 7 wherein at least one of the sets of intersecting columns and rows comprises a macro definition, wherein a plurality of track parameters contained in the macro definition are automatically entered using a predetermined macro label.

12. The system of claim 11 wherein at least one of the sets of intersecting columns and rows contains a name associated with the macro definition and coordinates defining a two-dimensional region, wherein track parameters associated with the macro are used by a router application to lay out tracks in the two-dimensional region.

13. The system of claim 1 wherein the origin is associated with an integrated circuit layout.

14. A method of extracting information for bumps and tracks of an integrated circuit, comprising:
creating a data structure;
extracting bump locations into the data structure from relative physical positions of bump labels in a table, wherein each bump label is associated with a bump;
determining if a macro defining a plurality of tracks exists;
if a macro defining a plurality of tracks exists, extracting track parameters into the data structure based on the macro;
if a macro defining a plurality of tracks does not exist, extracting track parameters into the data structure based on individual track definitions; and
extracting bump locations and track parameters from the data structure to create integrated circuit muting connections.

15. The method of claim 14 further comprising extracting at least one type of data contained in the table selected from the group consisting of:
spacing between bumps;
size of bumps; and
bump labels.

16. The method of claim 14 further comprising extracting coordinate positions of input/output circuitry of an integrating circuit into the data structure.

17. The method of claim 16 further comprising:
writing out the bump data and the coordinate positions of the input/output circuitry to a router application; and
displaying straight-line connections between locations of bumps and locations of input/output circuitry associated with each bump.

18. The method of claim 14 further comprising:
writing out the bump data, the coordinate positions of the input/output circuitry, and the track parameters to a router application; and
displaying bumps, input/output circuitry locations, and tracks to a user according to the bump data, the coordinate positions of the input/output circuitry, and the track parameters.

19. The method of claim 18 further comprising editing at least one type of data selected from the group consisting of the bump data and the track parameters in response to said displaying by accessing a single source file.

20. A system, comprising:
a CPU;
a graphic user interface coupled to the CPU; and
a memory coupled to the CPU, wherein the memory comprises computer readable instructions that when executed by the CPU provide:
  means for displaying bump positions on the graphic user interface using textual bump labels, wherein a location of a displayed bump label corresponds to a position of a bump relative to a predetermined origin of an integrated circuit,
  means for extracting the bump positions by interpreting locations of the bump labels displayed on the graphical user interface
  means for determining if a macro defining a plurality of tracks exists;
  if the macro exists, means for extracting track parameters based on the macro;
  if the macro does not exist, means for extracting track parameters based on individual track definitions; and
  means for creating integrated circuit routing connections based on the extracted bump positions and extracted track parameters.

21. The system of claim 20 wherein the computer readable instructions when executed by the CPU further provide means for condensing editable metal layer information viewable to a user.

22. The system of claim 21 wherein the computer readable instructions when executed by the CPU further provide means for extracting the condensed editable metal layer information for use by a router application.

* * * * *

UNITED STATES PATENT AND TRADEMARK OFFICE
CERTIFICATE OF CORRECTION

PATENT NO. : 7,131,094 B2 Page 1 of 1
APPLICATION NO. : 10/735549
DATED : October 31, 2006
INVENTOR(S) : Herbert R. Kolk et al.

It is certified that error appears in the above-identified patent and that said Letters Patent is hereby corrected as shown below:

On the Title page, in field (73), under "Assignee", in column 1, line 2, delete "LP.," and insert -- L.P., --, therefor.

In column 10, line 43, in Claim 14, delete "muting" and insert -- routing --, therefor.

In column 11, line 15, in Claim 20, delete "circuit," and insert -- circuit; --, therefor.

In column 11, line 18, in Claim 20, after "interface" insert -- ; --.

Signed and Sealed this

Fourteenth Day of July, 2009

JOHN DOLL
*Acting Director of the United States Patent and Trademark Office*